United States Patent [19]
Basi et al.

[11] 3,776,789
[45] Dec. 4, 1973

[54] METHOD FOR PROTECTING GaAs WAFER SURFACES

[75] Inventors: Jagtar S. Basi, Wappingers Falls; Edward M. Hull, Legrangeville, both of N.Y.

[73] Assignee: International Business Machines Corporation, Armonk, N.Y.

[22] Filed: May 1, 1972

[21] Appl. No.: 248,874

[52] U.S. Cl. ........................ 156/17, 156/3, 252/79.1
[51] Int. Cl. .............................................. H01l 7/50
[58] Field of Search .......................... 252/79.1, 79.5; 156/3, 17

[56] References Cited

UNITED STATES PATENTS 3,342,652 9/1967 Reisman et al. ...................... 156/17

*Primary Examiner*—William A. Powell
*Attorney*—Daniel E. Igo et al.

[57] ABSTRACT

A process for the protecton of gallium arsenide surfaces comprises treating the surface with sodium oxychloride solution to form an interim protective film and subsequently removing the protective film utilizing sodium oxychloride and sodium carbonate prior to further processing.

5 Claims, No Drawings

METHOD FOR PROTECTING GAAS WAFER SURFACES

BACKGROUND OF THE INVENTION

Field of the Invention

Gallium arsenide monocrystalline semiconductor substrates are utilized in the manufacture of semiconductor junctions, for example, light emitting diodes as well as other semiconductor and electronic applications. Gallium arsenide single crystal wafers are cut from ingots or boules produced, for example, in accordance with the often referred to horizontal Bridgeman method, more particularly described in pending application Ser. No. 180,041 filed Sept. 13, 1971 entitled "Process and Apparatus for Making Single Crystal Semiconductor Compounds".

Single crystal wafers of gallium arsenide having the desired crystallographic orientation, conductivity type, and impurity concentration are sliced from said ingots in accordance with well-known methods and in thicknesses from approximately 12 mils to 20 mils.

The wafer surfaces or slices are polished to a damage-free and featureless condition by chemical-mechanical techniques as described in U. S. Pat. No. 3,342,652 and in pending application Ser. No. 192,546 filed Oct. 26, 1971 entitled "Method for Polishing Semiconductor Gallium Phosphide Planar Surfaces'-'and application Ser. No. 189,114 filed Oct. 14, 1971 entitled "Method for Polishing Semiconductor Gallium Planar Surfaces". The polished gallium arsenide wafers are subjected to further processing in the manufacture of semiconductor junctions utilizing diffusion techniques or employed as substrates in the production of binary or tertiary compounds such as gallium arsenide phosphide which in turn are furhter processed to produce semiconductor junctions and light emitting diodes.

The surface condition of polished gallium arsenide wafers is fragile and susceptible to damage and contamination resulting from handling, shipping, further processing, and similar activity. Consequently, it is very desirable to have an efficient, low cost, and simplified method for protecting wafer or slice surfaces.

DESCRIPTION OF THE PRIOR ART

The preparation of semiconductor substrates having fine surface structure, planarity, uniformity, freedom from sawing or lapping damage, flatness, and the absence of any film is a prequisite to the manufacture of planar semiconductor devices. The chemical-mechanical methods utilized in polishing processes is believed to be the most appropriate procedure utilized in semiconductor wafer surface treatment. These methods involve a chemical reaction between the polishing solution and the lapped or sawed surface with simultaneous removal of reaction products by chemical or mechanical means, thereby producing a desirable semiconductor wafer surface condition adaptable to further processing.

Sodium oxychloride is known as an etchant utilized in chemical polishing techniques for germanium and gallium arsenide where highly polished damage-free surfaces are desired. U. S. Pat. No. 3,342,652 is an example of such a disclosure.

The strong covalent gallium arsenic bond in gallium arsenide makes dissolution in most strong acids such as sulfuric, hydrochloric and phosphoric acids slow and difficult. Similarly, strong bases such as sodium hydroxide, potassium hydroxide and sodium carbonate very slowly dissolve gallium arsenide.

The prior art methods for protecting gallium arsenide wafer surfaces included, among other things, utilizing special containers or devices whereby wafers are transported for processing or shipping in segregated special compartmentalized packages and supported by packaging materials and other means to avoid surface damage and contamination. Similarly, wafers and slices have been coated with stripable organic films such as collodion and similar stripable organic or other protecting films whereby polished surfaces have been protected prior to further processing or during shipping.

SUMMARY OF THE INVENTION

It is an object of this invention to provide a simplified and efficient method for protecting gallium arsenide polished wafer surfaces whereby special handling techniques are minimized.

It is a further object of this invention to provide a method for protecting polished gallium arsenide wafer surfaces prior to further processing.

It is still a further object of this invention to provide a chemical means of protecting polished gallium arsenide wafer surfaces without the use of toxic or volatile organic substances.

The foregoing and other objects are accomplished by providing a method for interim protection of gallium arsenide semiconductor wafers prior to further processing which comprises exposing the gallium arsenide wafer surface to a sodium oxychloride solution free from any alkali metal bases such as hydroxides and carbonates, at room temperature e. g. approximately 25°C, for a period of time sufficient to produce a self-limiting thin film of gallium arsenite upon the surface of the wafer, followed by a water rinse or wash, followed by a further pre-processing film removal by exposing the said gallium arsenite coated wafer to an agitated mixture of sodium oxychloride and sodium carbonate wherein said sodium carbonate concentration in the mixture is equal to or greater than the concentration of the sodium oxychloride contained in the mixture, followed by a quick water wash or quench thereby removing the previously formed protective film.

The foregoing and other objects, features and advantages of the invention will be more apparent and further understood from the following more particular description and illustrative preferred embodiments.

It is believed the chemical reaction between gallium arsenide and sodium oxychloride proceeds as follows:

$$GaAs + 3NaClo \rightarrow GaAsO_3 + 3NaCl$$

Gallium arsenite ($GaAsO_3$) constitutes a gray to black film upon the surface of a gallium arsenide wafer upon exposure to sodium oxychloride. The reaction proceeds at room temperature of approximately 25°C. The film formed is hard and protective and resists abrasion due to normal handling. Normally, a dry cotton swab brushed across a polished gallium arsenide wafer will scratch the surface of the wafer to an extent that the scratches so imparted, damage the highly polished surface so as to require repolishing. The film also protects the surface from attack by strong acids and bases such as sulphuric, hydrochloric acid, sodium hydroxide, and the like.

The sodium oxychloride solution should be free of alkali metal bases such as carbonates and hydroxides and have a concentration of 0.4 to 1.6 normal for adequate film formation. Within the limits of the aforesaid concentration, the reaction or film is self-limiting in that as the film forms from a light blue color to black, the reaction or film formation stops when the film is formed. Therefore, wafers of gallium arsenide should be uniformly exposed to the sodium oxychloride in an agitated or stirred solution in an open vessel or the wafers may be similarly treated upon the polishing wheel without the application of any polishing wheel pressure. When the desired film formation is completed, the wafers are water washed and stored in usual fashion for further work, shipment and the like.

After protecting the surface of a polished gallium arsenide wafer in accordance with the procedure described above, and it is desirable to remove the film for further processing or use, the wafer or wafers, as the case may be, are exposed or treated with a solution of sodium oxychloride and sodium carbonate. The concentration of both constituents of the solution can be from a minimum of 0.7 normal to 2 normal. However, in any event, the concentration of the carbonate must be equal to or greater than the concentration of sodium oxychloride. The exposure of gallium arsenide wafers to the aforesaid solution removes the film previously formed and exposes or returns the wafer surface to the original polished surface condition. A prompt or quick water rinse prepares the wafer or slice for further usage. The use of deionized water, although not critical, is believed to be desirable, followed by drying in a stream of nitrogen gas. The aforesaid film removal step is represented by the following equation:

$$GaAsO_3 + NaClO + 4\ Na_2CO_3 + 4H_2O \rightarrow NaGa(OH)_4 + Na_3AsO_4 + 4\ NaHCO_3$$

The following specific examples are intended to further explain and demonstrate the invention and are not in any way to be construed as limiting the disclosed:

EXAMPLE I

A number of polished tin doped gallium arsenide wafers having approximately one square inch of featureless surface area and about 20 mils thick were placed in about 20 cc of 0.4 normal sodium oxychloride solution contained in an open vessel and continuously stirred or agitated. The gallium arsenide pieces were maintained in the solution for about two minutes at room temperature of about 25°C. The wafers upon removal from the solution and water washing contained a specular black film upon the polished surface area.

The aforesaid wafers were exposed in a solution of a mixture of 0.8 normal sodium oxychloride and 0.8 normal sodium carbonate for two minutes at room temperature of approximately 25°C and followed by a quick water rinse or quench and blown dry with nitrogen.

The polished featureless surface appeared as the film was dissolved or removed whereupon the gallium arsenide wafer was in condition for further processing.

EXAMPLE II

The method as described in Example I was repeated except that 0.8 normal sodium oxychloride was used. A mat black film formed upon the gallium arsenide wafer and was removed to the original polished featureless surface as described above.

EXAMPLE III

The method as described in Example I was repeated except that about 10 cc of 0.1 normal sodium carbonate was added to the sodium oxychloride. No film was formed and the polished wafer surface was damaged and pitted.

EXAMPLE IV

A procedure as described in Example III was followed except that 0.1 normal sodium hydroxide was added to the sodium oxychloride. A damaged and pitted surface resulted without the formation of a protective film.

While the invention has been particularly shown and described with reference to preferred embodiments thereof, it will be understood by those skilled in the art that the foregoing and other changes in form and detail may be made therein without departing from the spirit and scope of the invention.

We claim:

1. A method for protecting the surface of gallium arsenide semiconductor wafers which comprises reacting said wafers with aqueous sodium oxychloride followed by subsequently reacting said wafers with an aqueous mixture of sodium oxychloride and sodium carbonate followed by a water rinse.

2. A method in accordance with claim 1 wherein the said sodium carbonate concentration is equal to or greater than said sodium oxychloride of the mixture.

3. A method in accordance with claim 1 wherein said aqueous sodium oxychloride is between 0.4 and 1.6 normal.

4. A method in accordance with claim 1 wherein said mixture of sodium oxychloride and sodium carbonate has respective concentrations of between 0.7 to 2 normal and wherein the concentration of sodium carbonate is equal to or greater than the concentration of sodium oxychloride.

5. A method in accordance with claim 1 wherein said reaction with sodium oxychloride is carried out (in situ) on a polishing apparatus at atmospheric pressure.

* * * * *